(12) United States Patent
Wu et al.

(10) Patent No.: US 8,867,289 B2
(45) Date of Patent: Oct. 21, 2014

(54) CHIP WITH EMBEDDED NON-VOLATILE MEMORY AND TESTING METHOD THEREFOR

(71) Applicant: Industrial Technology Research Institute, Hsinchu (TW)

(72) Inventors: Chun-Yen Wu, Hsinchu (TW); Chi-Chun Hsu, New Taipei (TW); Po-Sen Huang, Taipei (TW); Li-Ren Huang, Zhubei (TW); Wen-Dar Hsieh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 28 days.

(21) Appl. No.: 13/727,046

(22) Filed: Dec. 26, 2012

(65) Prior Publication Data

US 2014/0126313 A1 May 8, 2014

(30) Foreign Application Priority Data

Nov. 8, 2012 (TW) .............................. 101141614 A

(51) Int. Cl.
*G11C 7/00* (2006.01)
*G11C 29/00* (2006.01)

(52) U.S. Cl.
CPC ...................................... *G11C 29/00* (2013.01)
USPC ...................... 365/201; 365/200; 365/189.011

(58) Field of Classification Search
USPC .................... 365/201, 200, 189.011; 714/718
See application file for complete search history.

(56) References Cited

U.S. PATENT DOCUMENTS

| | | | |
|---|---|---|---|
| 6,151,693 A | 11/2000 | Arnold et al. | |
| 6,243,293 B1 * | 6/2001 | Van Houdt et al. | ...... 365/185.14 |
| 6,472,895 B2 | 10/2002 | Jaimsomporn et al. | |
| 6,661,719 B1 | 12/2003 | Shih et al. | |
| 6,754,117 B2 * | 6/2004 | Jeddeloh | ........................ 365/201 |
| 7,174,489 B2 | 2/2007 | Sadakata et al. | |
| 7,212,456 B2 * | 5/2007 | Callaway et al. | ............. 365/201 |

(Continued)

FOREIGN PATENT DOCUMENTS

| | | |
|---|---|---|
| CN | 1577632 | 2/2005 |
| CN | 102027549 A | 4/2011 |

(Continued)

OTHER PUBLICATIONS

English abstract translation of JP2011521396 (Published Jul. 21, 2011).

(Continued)

*Primary Examiner* — David Lam
(74) *Attorney, Agent, or Firm* — McClure, Qualey & Rodack, LLP

(57) ABSTRACT

A testing method for a chip with an embedded non-volatile memory and the chip is provided. A remapping circuit and the non-volatile memory are connected to a processor. The non-volatile memory has a test area and an area under test. The test area stores a test program, and the area under test stores data under test. When the processor tests the chip, the processor outputs an original instruction address, and the remapping circuit remaps the original instruction address to generate a remapped instruction address. The processor reads the test program in the test area, and executes the test program to read the data under test in the area under test and to perform a test of toggling the logic circuit.

18 Claims, 3 Drawing Sheets

(56) References Cited

U.S. PATENT DOCUMENTS

| | | | |
|---|---|---|---|
| 7,337,378 B2 | 2/2008 | Kondou | |
| 7,389,458 B2 | 6/2008 | Bacigalupo | |
| 7,843,747 B2 * | 11/2010 | Hsueh et al. | 365/201 |
| 7,872,930 B2 | 1/2011 | Chen et al. | |
| 2005/0007172 A1 | 1/2005 | Sadakata et al. | |
| 2009/0285044 A1 | 11/2009 | Chen et al. | |
| 2010/0271064 A1 | 10/2010 | Kohler et al. | |
| 2011/0209002 A1 | 8/2011 | Chopra | |
| 2012/0072788 A1 | 3/2012 | Chen et al. | |
| 2012/0072789 A1 | 3/2012 | Chen et al. | |

FOREIGN PATENT DOCUMENTS

| | | |
|---|---|---|
| CN | 102314950 A | 1/2012 |
| EP | 2289071 A1 | 3/2011 |
| JP | 2005031018 A | 2/2005 |
| JP | 2011521396 A | 7/2011 |
| KR | 20110021892 | 3/2011 |
| SG | 173976 A1 | 9/2011 |
| TW | I222079 | 10/2004 |
| TW | I227786 | 2/2005 |
| TW | 200713277 | 4/2007 |
| TW | I301617 | 10/2008 |
| TW | I313467 | 8/2009 |
| TW | 201003660 A | 1/2010 |
| WO | 2009140612 A1 | 11/2009 |

OTHER PUBLICATIONS

English abstract translation of JP2005031018 (Published Feb. 3, 2005).
English abstract translation of CN102314950 (Published Jan. 11, 2012).
English abstract translation of CN102027549 (Published Apr. 20, 2011).
English abstract translation of CN1577632 (Published Feb. 9, 2005).
English abstract translation of TWI313467 (Published Aug. 11, 2009).
English abstract translation of TWI301617 (Published Oct. 1, 2008).
English abstract translation of TWI227786 (Published Feb. 11, 2005).
English abstract translation of TWI222079 (Published Oct. 11, 2004).
English abstract translation of KR20110021892 (Published Mar. 4, 2011).
English abstract translation of TW200713277 (Published Apr. 1, 2007).
English abstract translation of TW201003660 (Published Jan. 16, 2010).
Chuang, et al: "A design for testability of non-volatile memory reliability test for automotive embedded processor"; Information and Communication Research Laboratories Industrial Technology Research Institute Hsinchu, Taiwan {chuangjo,chunyen627,andraw.hsu,lrhuang,wmcheng,HWD}@itri.org.tw; pp. 1-4 (Dec. 4, 2012).
Jagmohan, et al: "Adaptive Endurance Coding for NAND Flash"; IEEE Globecom 2010 Workshop on Application of Communication Theory to Emerging Memory Technologies;978-1-4244-8865-0/10/$26.00 © 2010 IEEE; pp. 1841-1845.
Robert A. Vetter: "Analysis of Integrated Circuit Failure Modes and Failure Mechanisms Derived From High Temperature Operating Life Tests"; McDonnell Douglas Astronautics Company—East P.O. Box 516 St. Louis, Missouri 63166; pp. 133-137. (Apr. 1973).
Dragan Pantic: Benefits of Integrated-Circuit Burn-In to Obtain High Reliability Parts; IEEE Transactions on Reliability, vol. R-35, No. 1, Apr. 1986; pp. 3-6.
Wang, et al.: "Charge Retention of Silicided and Unsilicided Floating Gates in Embedded Logic Nonvolatile Memory"; Technology Development, Impinj Inc. 701 N 34th Street, Suite 300, Seattle, WA, 98103 Phone: 206-834-1107, bin.wang()irnpinj.com; 2005 IIRW Final Report 0-7803-8992-11051$20.00 @2005 IEEE; pp. 67-70.
Fellner, et al.: "Fully Automatical Test and Qualification System for a High Endurance Embedded EEPROM Module"; austriamicrosystems AG Schloss Premstaetten, A-8141 Unterpremstaetten http://www.austriamicrosystems.com; 978-1-4244-2194-71081$25.00 © 2008 IEEE 200 IIIRW Final Report; pp. 118-120.
Plantier, et al.: "Investigation of EEPROM Memories Reliability during Endurance and Retention Tests"; IM2NP, UMR 6242 CNRS, IMT Technopole Chateau Gombert, 13451 Marseille—France phone: +33491 054784/ fax: +33 491 054782/ email: Hassen.Aziza@polytech.univ-rnrsJr 2STMicroelectronics, ZI Rousset BP 2, F-13106 Rousset Cedex, France; 978-1-4244-4321-5/09/$25.00 © 2009 IEEE; pp. 241-246.

* cited by examiner

CHIP WITH EMBEDDED NON-VOLATILE MEMORY AND TESTING METHOD THEREFOR

This application claims the benefit of Taiwan application Serial No. 101141614, filed Nov. 8, 2012, the disclosure of which is incorporated by reference herein in its entirety.

TECHNICAL FIELD

The disclosed embodiments relate to a chip with an embedded non-volatile memory and testing method therefor.

BACKGROUND

With developments of automobile industries, built-in embedded software prevails in various automotive electronic devices. In these electronic devices, a non-volatile memory is frequently adopted for storing the software. The reliability of a non-volatile memory is a critical issue for an automotive embedded processor. In the event of a malfunctioning non-volatile memory, a control system of an automobile may be damaged to cause a malfunctioning automobile that further leads to severe human casualties and property losses. AEC-Q100 qualification standards have been proposed by the Automotive Electronics Council to specify expected product quality and reliability. Therefore, it is a goal of industrialists to provide an accurate and low-cost test method for an automotive chip to ensure the safety of automobile employing the automotive chip.

SUMMARY

According to one exemplary embodiment, a chip with an embedded non-volatile memory is provided. The chip comprises a processor, a remapping circuit, a non-volatile memory and a logic circuit. The remapping circuit is electrically connected to the processor and the non-volatile memory, and the logic circuit is electrically connected to the processor. The non-volatile memory is also electrically connected to the processor. The non-volatile memory has a test area and an area under test. The test area stores a test program, and the area under test stores data under test. When the processor tests the chip, the processor outputs an original instruction address, and the remapping circuit remaps the original instruction address to generate a remapped instruction address. The processor reads the test program in the test area, and executes the test program to read the data under test in the area under test and to perform a test of toggling the logic circuit.

According to another exemplary embodiment, a test method for a chip with a non-volatile memory is provided. The test method includes the following steps. A chip having a processor, a non-volatile memory and a logic circuit is provided. The non-volatile memory has a test area and an area under test. The test area stores a test program, and the area under test stores data under test. The processor reads and executes the test program by performing at least: initializing the chip, reading an N number of bytes of data under test from a starting address of the area under test, and iterating the test steps below until the data under test in the area under test is completely read: toggling the logic circuit, and reading a next N number of bytes of data under test from the area under test.

Figure 1:
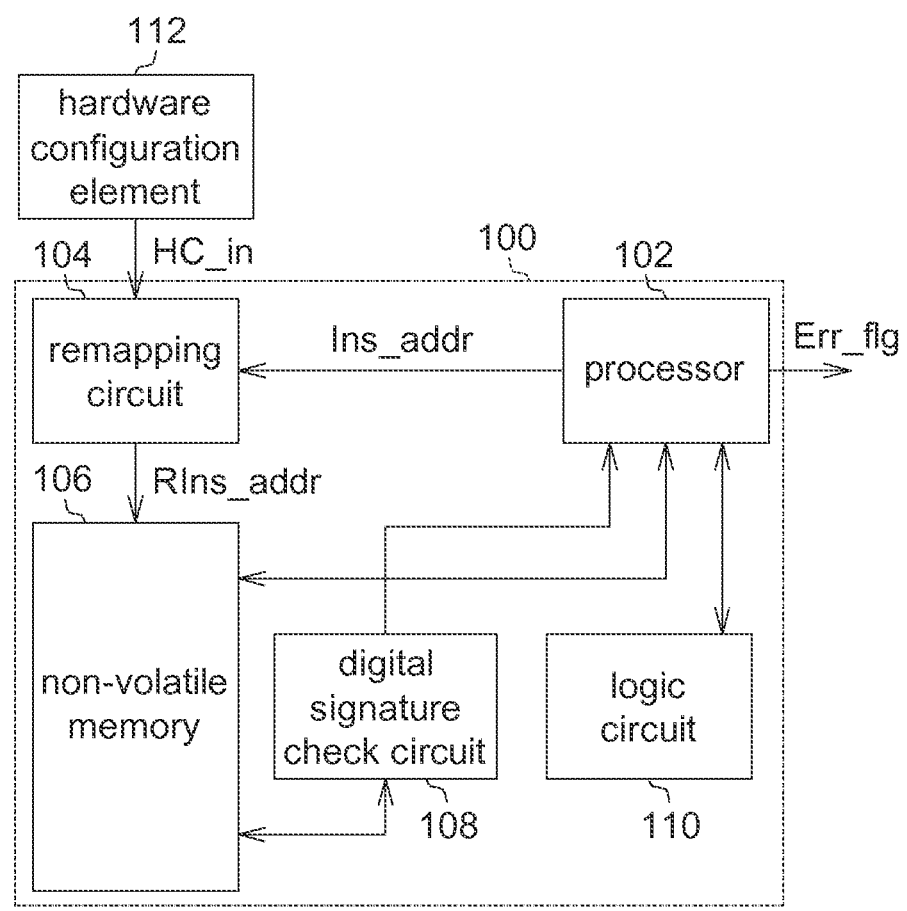
FIG. 1 is a block diagram of a chip with an embedded non-volatile memory according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a block diagram of a chip with an embedded non-volatile memory according to one embodiment. A chip 100 comprises a processor 102, a remapping circuit 104, a non-volatile memory 106 and a logic circuit 110. The remapping circuit 104 is electrically connected to the processor 102 and the non-volatile memory 106, and the non-volatile memory 106 is also electrically connected to the processor 102. The non-volatile memory 106 has a test area and an area under test. The test area stores a test program, and the area under test stores data under test.

When the processor 102 performs a test procedure on the chip 100, e.g., a high temperature operation life (HTOL) and/or burn-in reliability test, the processor 102 outputs an original instruction address Ins_addr. The remapping circuit 104 remaps the original instruction address Ins_addr to generate a remapped instruction address RIns_addr. According to the remapped instruction address RIns_addr, the processor 102 reads and executes the test program to read data under test in the area under test and to perform a test of toggling the logic circuit 110, so as to determine the reliability of the chip 100.

Since the processor 102 directly reads the test program in the test area of the non-volatile memory 106 and executes the test program to test the chip 100, the embodiment significantly reduces external hardware involved for testing the chip 100 and thus substantially lowers test costs.

The chip 100 may further comprise a digital signature check circuit 108 electrically connected to the non-volatile memory 106 and the processor 102, and a logic circuit 110 electrically connected to the processor 102. The digital signature check circuit 108 checks whether a program code of the test program in the test area is correct, or verifies data integrity and validity of the test program in the test area. When the processor 102 executes the test program, the processor 102 toggles the logic circuit 110, so as to render the logic circuit 110 to be in different biased states. Further, a hardware configuration element 112 may be employed to output a hardware configuration signal HC_in to the remapping circuit 104 to control the remapping circuit 104.

Figure 2:
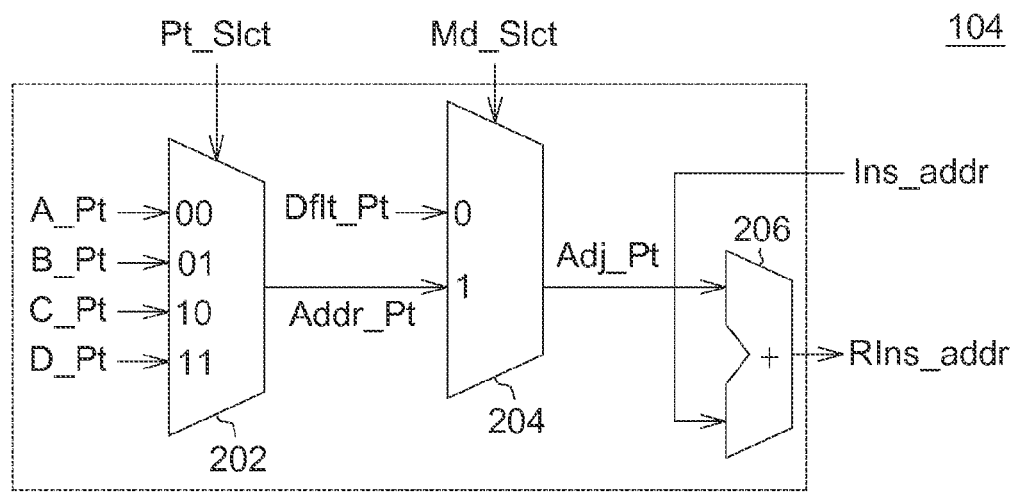
FIG. 2 is a block diagram of a remapping circuit in FIG. 1 according to one embodiment.

FIG. 2 shows a block diagram of the remapping circuit 104 in FIG. 1 according to one embodiment. For example, the hardware configuration signal HC_in comprises a pointer address selecting signal Pt_Slct and a mode selecting signal Md_Slct. The remapping circuit 104 comprises a first selector 202, a second selector 204 and an adder 206. The first selector 202 is controlled by the pointer address selecting signal Pt_Slct to selectively output a pointer address Addr_Pt. The second selector 204 is controlled by the mode selecting signal Md_Slct to receive the pointer address Addr_Pt, and to selectively output the pointer address Addr_Pt as an adjustment address Adj_Pt. The adder 206 adds the original instruction address Ins_addr to the adjustment address Adj_Pt to generate the remapped instruction address RIns_addr.

For example, under the control of the pointer address selecting signal Pt_Slct, the first selector 202 selects one from multiple candidate addresses to serve as the pointer address Addr_Pt. For example, the multiple pointer addresses are candidate addresses A_Pt, B_Pt, C_Pt and D_Pt. Under the control of the mode selecting signal Md_Slct, the second selector 204 selects and outputs either a predetermined address Dflt_Pt or the pointer address Addr_Pt to serve as the adjustment address Adj_Pt.

That is to say, when the hardware configuration element 112 is adjusted to set to a corresponding status of the chip 100 under test, the mode selecting signal Md_Slct is enabled, and the second selector 204 outputs the pointer address Addr_Pt as the adjustment address Adj_Pt. The pointer address selecting signal Pt_Slct then corresponds to a control value (e.g., one of the four binary values 00, 01, 10 and 11) of the to-be-selected candidate pointer address A_Pt, B_Pt, C_Pt or D_Pt, so as to control the first selector 202 to select and output one of the candidate addresses A_Pt, B_Pt, C_Pt and D_Pt. For example, the candidate addresses A_Pt, B_Pt, C_Pt and D_Pt respectively correspond to four different memory addresses in the non-volatile memory 106. For example, the selected candidate address is a starting address of the test area, i.e., a starting address of the non-volatile memory 106 storing the test program.

Before testing the chip 100, the test program and the data under test should be respectively downloaded to the test area and the area under test in the non-volatile memory 106. Due to different program languages, coding and compiling methods or test items of the test program, a size of the program code may be different. By setting different addresses for the test area, the test area is given different sizes, so as to select different candidate addresses A_Pt, B_Pt, C_Pt and D_Pt as the starting address of the test area for different memory storage spaces required by different test programs. Further, an area near the end of the non-volatile memory 106 may be assigned as the test area.

When one of the candidate addresses A_Pt, B_Pt, C_Pt and D_Pt is selected and outputted as the pointer address Addr_Pt that is also selected as the adjustment address Adj_Pt and outputted to the adder 206, the adder 206 adds the original instruction address Ins_addr to the adjustment address Adj_Pt equivalent to the selected candidate address to generate the remapped instruction address RIns_addr. That is, a value of the remapped instruction address RIns_addr is a sum of the original instruction address Ins_addr and the selected candidate address. During the test, the original instruction address Ins_addr outputted by the processor 102 is the starting address (e.g., with an address value of 0) of the non-volatile memory 106, and so the sum (i.e., the remapped instruction address RIns_addr) of the original instruction address Ins_addr and the selected candidate address is the selected candidate address (i.e. the starting address of the test area of the non-volatile memory 106). Thus, the processor 102 accesses the test area of the non-volatile memory 106 according to the remapped instruction address to read the test program.

When the hardware configuration element 112 is adjusted or set to a corresponding status of the chip 100 operating in normal conditions rather than being under test, the mode selecting signal Md_Slct is disabled, and the second selector 204 outputs the predetermined address Dflt_Pt as the adjustment address. The remapped instruction address RIns_addr is then the sum of the original instruction address Ins_addr and the adjustment address Adj_Pt (i.e., the predetermined address Dflt_Pt). In practice, the predetermined address may be set to 0, such that the remapped instruction address RIns_addr is equivalent to the original instruction address Ins_addr. Thus, the processor 102 may directly access the non-volatile memory 106 according to the remapped instruction address RIns_addr equivalent to the original instruction address Ins_addr, so as to maintain the chip 100 in a normal operating status.

Under the premise that the processor 102 is allowed to read the test program stored in the test area according to the remapped instruction address RIns_addr, the above design of the candidate addresses A_Pt, B_Pt, C_Pt and D_Pt may also be other types of designs, e.g., designing the values of the candidate addresses to correspond to values of memory spaces of different test areas.

The hardware configuration element 112 may be implemented by setting pin statuses via a switch. By switching the statuses of different pins, the values of the pointer address selecting signal Pt_Slct and the mode selecting signal Md_Slct may be modified.

Figure 3:
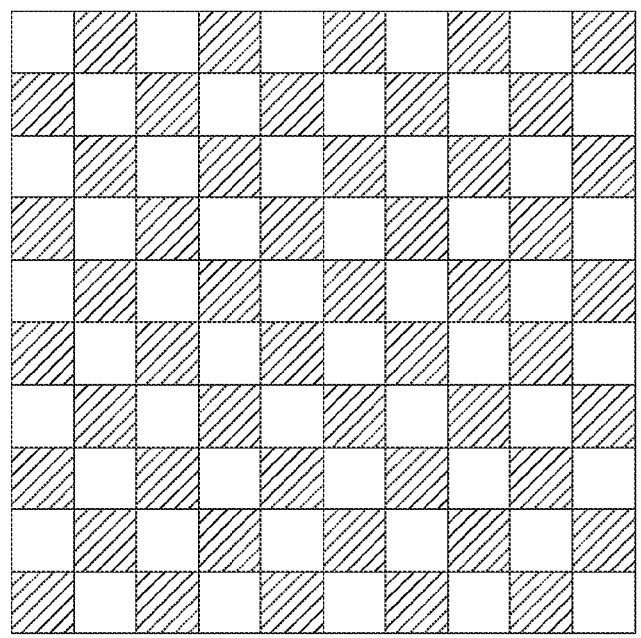
FIG. 3 is a schematic diagram of a data format of checkerboard pattern data according to one embodiment.

For example, the chip 100 with the embedded non-volatile memory may be applied as an automotive embedded non-volatile memory chip. For example, the data under test may be checkerboard pattern data or data of other similar patterns, and includes data of a hexadecimal digital value 0x55AA, as shown in FIG. 3 according to one embodiment. The test area is filled by the checkerboard pattern data, so that the processor 102 may determine whether each memory storage unit is functional through reading the checkerboard pattern data. During the comparison, the processor 102 compares the data under test read from the test area with the comparison pattern data to complete the comparison process. In one embodiment, for example, when the data under test is a checkerboard pattern, the comparison pattern is a corresponding checkerboard pattern.

A test method for a chip with embedded non-volatile memory is described in detail below. According to one embodiment, a chip having a processor, a non-volatile memory and a logic circuit is provided. The non-volatile memory has a test area and an area under test. The test area stores a test program, and the area under test stores data under test. The processor reads and executes the test program by performing at least: initializing the chip, reading an N number of bytes of data under test from a starting address of the area under test, and iterating the test steps below until the data under test in the area under test is completely read: toggling the logic circuit, and reading a next N number of bytes of data under test from the area under test.

When the data under test in the area under test is completely read, the step of reading the N number of bytes of data under test from the starting address of the area under test can be iterated, and the test steps are repeated until the test procedure ends.

Figure 4:
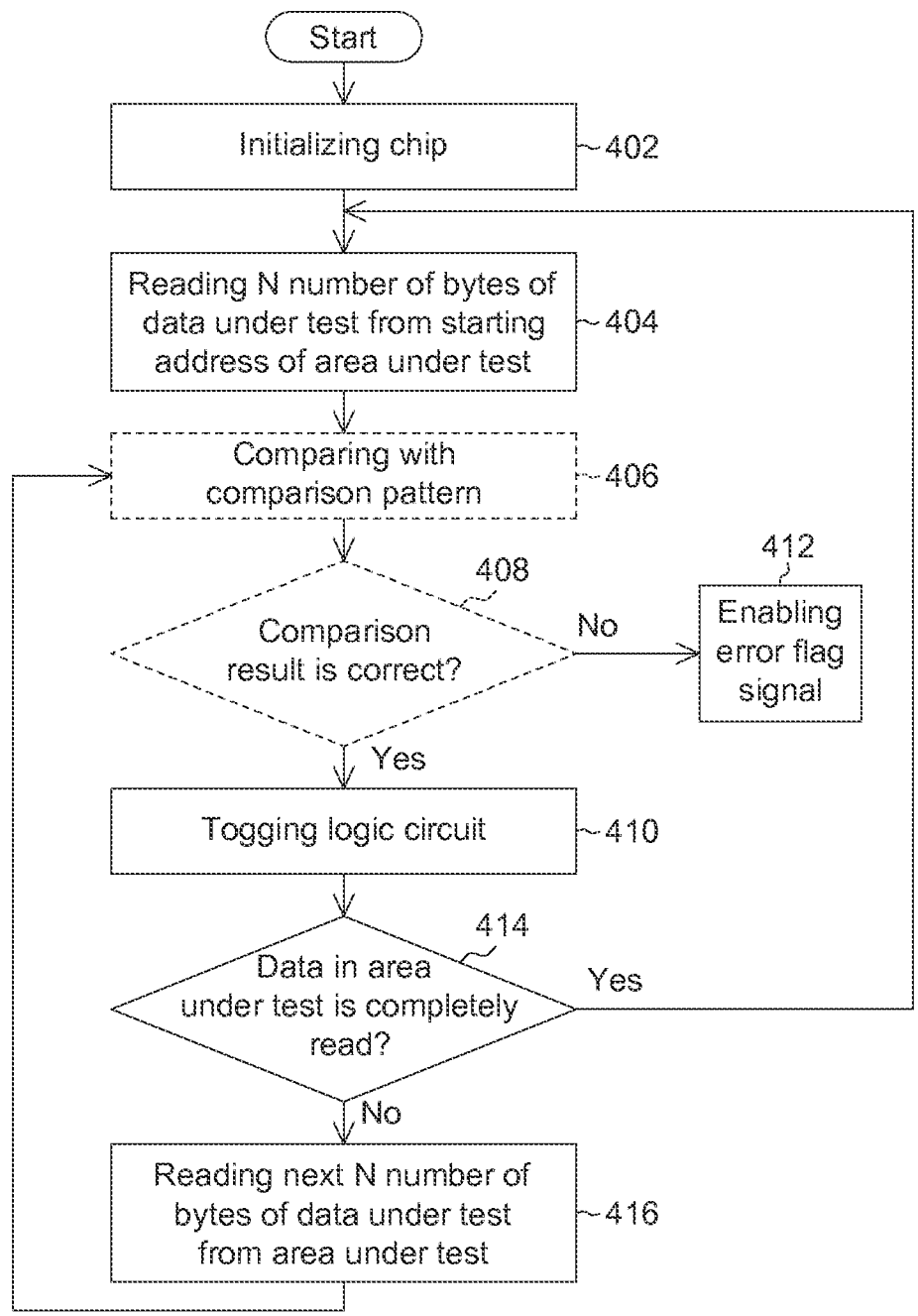
FIG. 4 is a flowchart of a test method for a chip with an embedded non-volatile memory according to one embodiment.

Exemplary embodiments are described in detail below also with reference to FIG. 1. FIG. 4 shows a flowchart of a test method for a chip with an embedded non-volatile memory according to one embodiment. The processor 102 first reads and executes the test program in the test area. In step 402, the chip 100 is initialized. In step 404, the processor 102 reads an N number of bytes of data under test from the starting address of the area under test.

In one embodiment, an optional comparison step with a comparison pattern can be performed as step 406. In step 408, the processor 102 determines whether a comparison result is correct. When the comparison result is negative, step 412 is performed in which the processor 102 enables an error flag signal Err_flg to indicate a test failure. When the comparison result is affirmative, step 410 is performed to toggle the logic circuit. In another embodiment, step 410 may be directly performed after step 404 without carrying the comparison step with a comparison pattern. In one embodiment, for example, the data under test and the comparison pattern data may be a checkerboard pattern.

In step 414, the processor 102 determines whether the data in the area under test is completely read. If not, step 416 is performed, in which the processor 102 reads a next N number of bytes of data under test from the area under test. In one embodiment comprising the comparison step with comparison pattern data, step 406 is iterated. In another embodiment excluding the comparison step with comparison data, step 410 is iterated. Further, when the processor 102 determines that the data in the area under test is completely read in step 414, the process returns to step 404. The process is repeated until a predetermined test period ends.

In one embodiment, it can be determined whether the program code in the test program stored in the test area of the non-volatile memory 106 is correct by checking independently using a digital signature, so as to ensure the correctness of the test program executed by the processor 102 and thus obtain a correct test result. When it is determined that contents of the test area are incorrect, another error flag signal Err_flg2 (not shown) can be enabled to indicate a test failure.

Further, the processor 102 may also read the test program according to a remapped instruction address. After the test procedure is complete, the test area may be exchange with the area under test and a second test may be performed on the new area under test, so as to test whether multiple memory storage units of the original test area of the non-volatile memory 106 are functional. Before the second test, a part of the original area under test may be designed as a new test area, whereas areas other than the new test area then become new areas under test. Before the test, the test program is downloaded to the new test area, new comparison data is filled in the new area under test, and the mode selecting signal Md_Slct is set as the predetermined address Dflt_Pt at this point. After repeating the above test procedure, all the memory storage units of the entire non-volatile memory 106 can be completely tested. For example, in the second test, the test area may be designated as the starting address of the non-volatile memory 106, and the mode selecting signal Md_Slct is set in a status that the second selector 204 selects the predetermined address Dflt_Pt at this point.

In the above embodiment, the positions of the test area and the area under test in the non-volatile memory are given as examples. In practice, the test area and the area under test may be allocated to other positions of the non-volatile memory according to actual requirements.

Further, the non-volatile memory 106 may also be implemented through different designs. For example, the non-volatile memory 106 may be implemented by one flash memory. Alternatively, the non-volatile memory 106 may be implemented by two flash memories, with one of the flash memory having the test area and the other having the area under test. Alternatively, the non-volatile memory 106 may include a read-only memory (ROM) and a flash memory, with the ROM having the test area and the flash memory having the area under test.

For example, the digital signature check circuit 108 is implemented by a word-base exclusive-or operation. For example, the digital signature check circuit 108 performs a signature operation. When reaching the last word in the test area during the signature operation, words having content values of being 1 are compared to accordingly determine whether the contents stored in the test area are correct.

In the chip and test method according to the above embodiments, by merely determining the status of the pin of the error flag signal of the processor, it can be determined whether the chip passes the test without connecting numerous I/O pins of the chip to external hardware devices, thereby simplifying the test process as the external hardware devices are uninvolved and thus significantly reducing test costs. The above embodiments satisfy test requirements defined by ACE-Q100 standards for non-volatile memories and yield good test accuracy. Thus, the embodiments are suitable for applications demanding high security requirements, such as automotive chips, for example.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A chip with an embedded non-volatile memory, comprising:
    a processor;
    a logic circuit, electrically connected to the processor;
    a remapping circuit, electrically connected with the processor;
    a non-volatile memory, electrically connected to the processor and the remapping circuit, having a test area and an area under test, the test area storing a test program, the area under test storing data under test; and
    a digital signature check circuit, electrically connected to the non-volatile memory and the processor, for checking whether a program code of the test program in the test area is correct;
    wherein, when the processor tests the chip, the processor outputs an original instruction address, the remapping circuit remaps the original instruction address to generate a remapped instruction address, and the processor reads and executes the test program in the test area according to the remapped instruction address to read the data under test in the area under test and to perform a test of toggling the logic circuit.

2. The chip according to claim 1, wherein the remapping circuit is controlled by a hardware configuration signal outputted by a hardware configuration element.

3. The chip according to claim 2, wherein the hardware configuration signal comprises a pointer address selecting signal and a mode selecting signal; and the remapping circuit comprises:
    a first selector, controlled by the pointer address selecting signal to selectively output a pointer address;
    a second selector, controlled by the mode selecting signal to receive the pointer address and to selectively output the pointer address as an adjustment address; and
    an adder, for adding the original instruction address to the adjustment address to generate the remapped instruction address.

4. The chip according to claim 3, wherein the first selector is controlled by the pointer address selecting signal to select one from a plurality of candidate addresses to serve as the pointer address.

5. The chip according to claim 3, wherein the second selector is controlled by the mode selecting signal to select and output either a predetermined address or the pointer address to serve as the adjustment address.

6. The chip according to claim 1, wherein the non-volatile memory comprises a first flash memory and a second flash memory, the first flash memory has the test area, and the second flash memory has the area under test.

7. The chip according to claim 1, wherein the non-volatile memory comprises a read-only memory (ROM) and a flash memory, the ROM has the test area, and the flash memory has the area under test.

8. The chip according to claim 1, wherein the chip with the embedded non-volatile memory is an automotive non-volatile memory chip.

9. The chip according to claim 1, wherein the data under test is checkerboard pattern data.

10. A test method for chip with an embedded non-volatile memory, comprising:
providing a chip, the chip comprising a processor, a non-volatile memory and a logic circuit, the non-volatile memory having a test area and an area under test, the test area storing a test program, the area under test storing data under test, the processor reading and executing the test program, comprising:
initializing the chip;
reading an N number of bytes of data under test from a starting address of the area under test; and
iterating test steps below until the data under test in the test area is completely read:
toggling the logic circuit;
reading a next N number of bytes of data under test from the area under test; and
check whether a program code of the test program in the test area is correct by a digital signature.

11. The test method according to claim 10, further comprising:
comparing the read data under test with comparison pattern data, and determining whether a comparison result is correct.

12. The test method according to claim 11, further comprising:
enabling an error flag signal when it is determined that the comparison result is incorrect.

13. The test method according to claim 11, wherein the data under test and the comparison pattern data are checkerboard pattern data.

14. The test method according to claim 10, wherein the processor reads the test program according to a remapped instruction address.

15. The test method according to claim 10, wherein the chip with the embedded non-volatile memory is an automotive non-volatile memory chip.

16. The test method according to claim 10, wherein the non-volatile memory comprises a first flash memory having the test area, and a second flash memory having the area under test.

17. The test method according to claim 10, wherein the non-volatile memory comprises a ROM having the test area, and a flash memory having the area under test.

18. The test method according to claim 10, further comprising:
when the data under test is completely read, reading an N number of bytes of data under test from the starting address of the area under test, and iterating the test steps.

* * * * *